(12) United States Patent
Nishizaki

(10) Patent No.: US 10,339,980 B2
(45) Date of Patent: Jul. 2, 2019

(54) APPARATUSES AND METHODS FOR CONTROLLING WORDLINES AND SENSE AMPLIFIERS

(71) Applicant: Micron Technology, Inc., Boise, ID (US)

(72) Inventor: Mamoru Nishizaki, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/029,046

(22) Filed: Jul. 6, 2018

(65) Prior Publication Data

US 2018/0315457 A1 Nov. 1, 2018

Related U.S. Application Data

(63) Continuation of application No. 15/488,328, filed on Apr. 14, 2017, now Pat. No. 10,020,038.

(51) Int. Cl.

| | |
|---|---|
| *G11C 5/02* | (2006.01) |
| *G11C 5/06* | (2006.01) |
| *G11C 7/18* | (2006.01) |
| *G11C 8/10* | (2006.01) |
| *G11C 11/408* | (2006.01) |
| *G11C 11/4097* | (2006.01) |
| *G11C 29/00* | (2006.01) |
| *G11C 29/02* | (2006.01) |

(Continued)

(52) U.S. Cl.
CPC ............. *G11C 5/025* (2013.01); *G11C 5/06* (2013.01); *G11C 7/12* (2013.01); *G11C 7/18* (2013.01); *G11C 8/10* (2013.01); *G11C 11/4087* (2013.01); *G11C 11/4097* (2013.01); *G11C 29/00* (2013.01); *G11C 29/025* (2013.01); *H01L 27/108* (2013.01); *G11C 2029/1202* (2013.01); *G11C 2029/1204* (2013.01)

(58) Field of Classification Search
CPC .................................. G11C 5/025; G11C 5/06
USPC .......................................................... 365/63
See application file for complete search history.

(56) References Cited

U.S. PATENT DOCUMENTS

| | | |
|---|---|---|
| 5,132,933 A | 7/1992 | Schreck et al. |
| 5,901,086 A | 5/1999 | Wang et al. |

(Continued)

OTHER PUBLICATIONS

U.S. Appl. No. 15/488,328, entitled: "Apparatuses and Methods for Controlling Wordlines and Sense Amplifiers" filed Apr. 14, 2017.

*Primary Examiner* — Son L Mai
(74) *Attorney, Agent, or Firm* — Dorsey & Whitney LLP

(57) ABSTRACT

Apparatuses for controlling defective bit lines in a semiconductor device are described. An example apparatus includes: a first region including a plurality of bit lines, a plurality of word lines and a plurality of memory cells, each memory cell is coupled to an associated bit line and an associated word line; a second region including a plurality of sense amplifiers, each sense amplifier includes a sense node and a column selection switch coupled to the sense node; a third region including a plurality of bleeder circuits, and disposed between the first and second regions; and a plurality of column selection lines. Each bit line from the first region to the second region is coupled to the sense node of an associated one of the plurality of sense amplifiers, and each column selection line from the column selection switch is coupled to an associated bleeder circuit.

27 Claims, 14 Drawing Sheets

(51) Int. Cl.
*G11C 7/12* (2006.01)
*H01L 27/108* (2006.01)
*G11C 29/12* (2006.01)

(56) References Cited

U.S. PATENT DOCUMENTS

| | | | |
|---|---|---|---|
| 6,078,538 | A | 6/2000 | Ma et al. |
| 6,556,503 | B2 | 4/2003 | Schreck |
| 6,664,634 | B2 | 12/2003 | Thompson et al. |
| 6,934,208 | B2 | 8/2005 | Thompson et al. |
| 6,947,346 | B2 | 9/2005 | Shore et al. |
| 8,659,932 | B2 * | 2/2014 | Scheuerlein ........... B82Y 10/00 365/148 |
| 2003/0039167 | A1 | 2/2003 | Schreck |
| 2014/0003113 | A1 | 1/2014 | Seno et al. |

\* cited by examiner

APPARATUSES AND METHODS FOR CONTROLLING WORDLINES AND SENSE AMPLIFIERS

CROSS-REFERENCE TO RELATED APPLICATION(S)

This application is a continuation of U.S. patent application Ser. No. 15/488,328 filed Apr. 14, 2017, which is incorporated herein by reference, in its entirety, for any purpose.

BACKGROUND

High data reliability, high speed of memory access, lower power consumption and reduced chip size are features that are demanded from semiconductor memory. One of defects that lowers the data reliability is a breaking in a wire for Y-address (e.g., a column address) selection (YS). The breaking in the wire for Y-address tends to be undetected in a post-manufacturing test.

Techniques to remedy the disconnection due to the broken wire have been introduced to the semiconductor memory. For example, redundancy wires for address lines have been introduced to replace the broken wires, which improve data reliability of the semiconductor memory. A Y-address selection line (YS) driver does not activate the broken wire. In some cases, a signal disconnection occurs in proximity to a location where the wire may be broken. The broken YS wire is divided into two parts, one part connected to the YS driver and the other part not connected to the YS driver. The other part not connected to the YS driver is in an electrically floating state that is not stable and takes any voltage level, including a logic high level of the Y-address wire indicative of an "ON" state. As a result, a data on a local input/output line can be overwritten by the "ON" state signal due to the electrically floating state of the other part of the broken YS wire.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
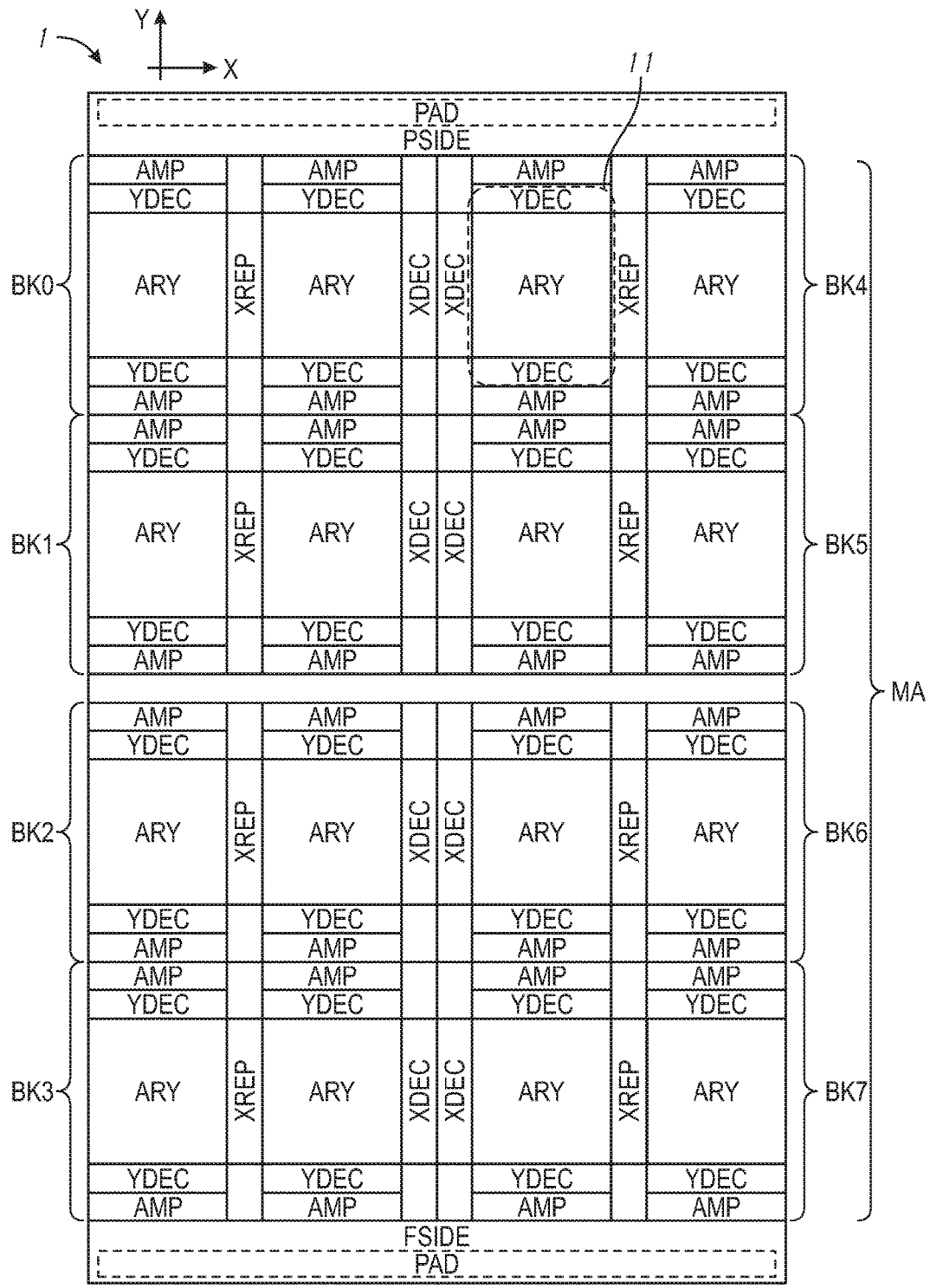
FIG. 1A is a layout diagram of a memory chip in a semiconductor memory device, in accordance with an embodiment of the present disclosure.

FIG. 1A is a layout diagram of a memory chip 1 in a semiconductor memory device, in accordance with an embodiment of the present disclosure. The memory chip 1 may be DRAM or non-volatile RAM integrated into a single semiconductor memory device, for example, however, other devices may also be the memory chip 1 of the present disclosure. The memory chip 1 may be mounted on a memory module substrate, a mother board or the like (not shown).

The memory chip 1 may include a memory area MA between a plurality of peripheral circuit areas on a plurality of sides of the memory area MA in a Y (e.g., column) direction. The plurality of peripheral circuit areas may include a peripheral circuit area PSIDE including a pad area PAD along an edge of the semiconductor chip, and a peripheral circuit area FSIDE including another pad area PAD along another edge of the semiconductor chip on the opposite side to the first peripheral circuit area PSIDE. For example, the peripheral circuit area PSIDE for address reception may include an input receiver that receives an address input signal via an address pin and an address latch circuit that latches the address input signal. For example, the peripheral circuit area FSIDE for handling data input/output may include an output buffer that provides read data to a data input/output (I/O) pin in the pad area PAD, and an input receiver that receives write data supplied via the data I/O pin.

The memory area MA between the peripheral circuit areas PSIDE and FSIDE may include a plurality of banks. For example, the plurality of banks may be BK0 to BK7, including memory banks BK0 to BK3 arranged in this order along a Y direction in a left half of the memory chip 1 in an X direction and memory banks BK4 to BK7 arranged in this order along the Y direction in a right half of the memory chip 1 in the X direction, as shown in FIG. 1A. Each memory bank of the memory banks BK0 to BK7 in the memory area MA may include two memory cell array areas ARY arranged next to each other in the X direction, a row decoder XDEC and a repeater circuit XREP. Each memory bank may include a plurality of word lines, a plurality of bit lines, and a plurality of memory cells in each memory cell array areas ARY arranged at intersections of the plurality of word lines and the plurality of bit lines. For example, the row decoder XDEC may be located at one end of the memory bank in the X direction and the repeater circuit XREP may be located between the two memory cell array areas ARY in each memory bank. Each memory bank of the memory banks BK0 to BK7 may also include a portion 11 including a plurality of column decoders YDEC adjacent to a plurality of sides of each of the memory cell array areas ARY in the Y direction. Each memory bank of the memory banks BK0 to BK7 may also include a plurality of main amplifiers AMP adjacent to a plurality of sides of the portion 11 in the Y direction. Although it is not particularly limited, two memory cell array areas ARY of each memory bank may be selected by an address bit Y1 included in a column address.

The selection of the bit line is performed by a plurality of column decoders YDEC and the selection of the word line is performed by a plurality of row decoders XDEC. The row decoder XDEC may select a plurality of sub-word lines in the memory cell array areas ARY based on a row address. The repeater circuit XREP may relay an output signal of the row decoder XDEC. The column decoder YDEC may select a plurality of sense amplifiers in the memory cell array area ARY based on the column address. Thus a memory cell identified by a selected sub-word line and a selected bit line coupled to a selected sense amplifier may be activated. The selected sense amplifiers may be coupled to the main amplifiers AMP via a main input/output line (MIO) (not shown).

Figure 1B:
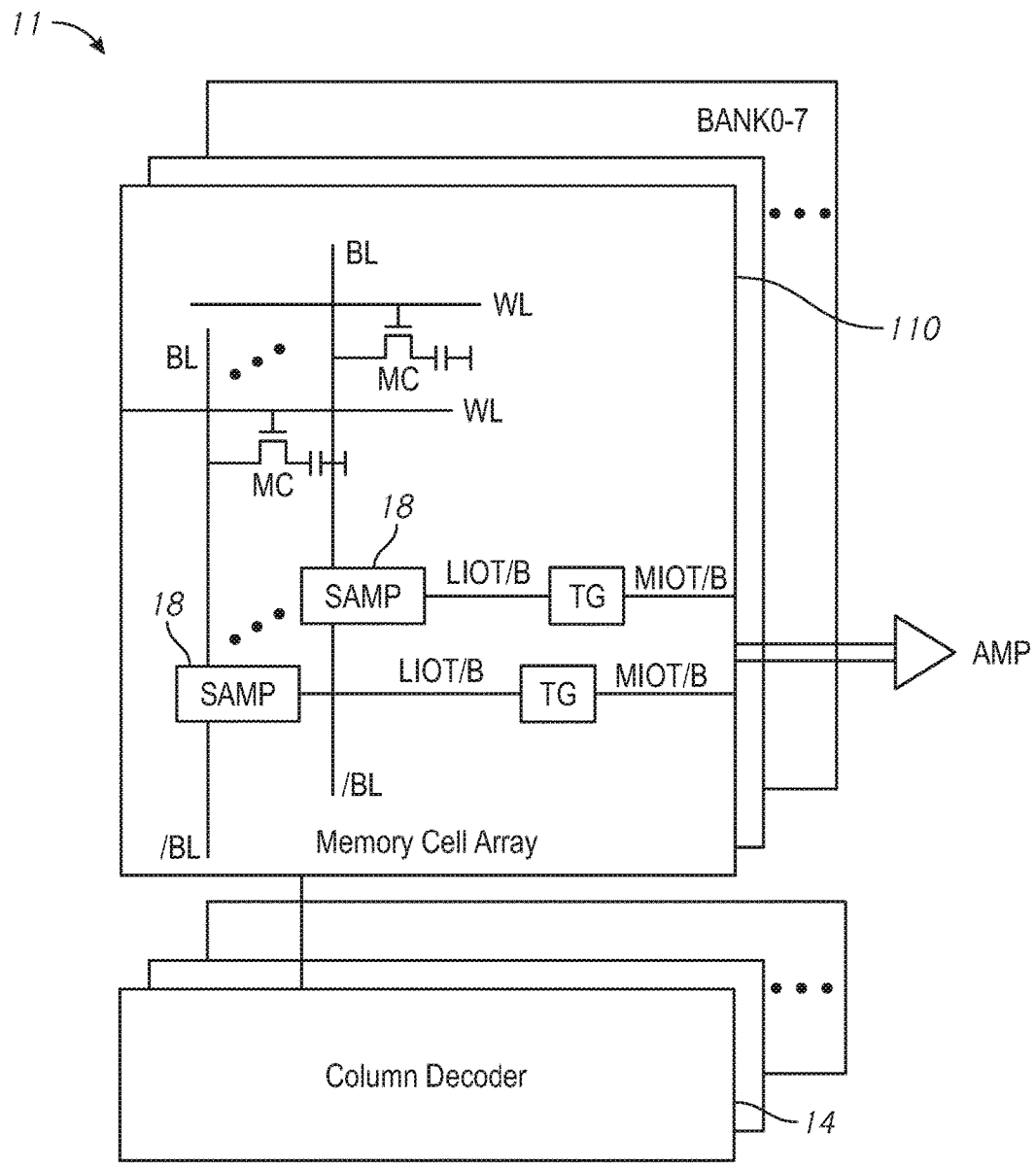
FIG. 1B is a block diagram of an array in the memory chip in accordance with an embodiment of the present disclosure.

FIG. 1B is a block diagram of an array in the memory chip in accordance with an embodiment of the present disclosure. As shown in FIG. 1B, the portion 11 includes a plurality of banks 110 including a plurality of arrays, each array including a plurality of word lines WL, a plurality of bit lines BL, and a plurality of memory cells MC arranged at intersections of the plurality of word lines WL and the plurality of bit lines BL. The selection of the word line WL is performed by a row decoder (not shown) and the selection of the bit line BL is performed by a column decoder 14. A plurality of sense amplifiers SAMP 18 are coupled to corresponding bit lines BL and connected to local I/O line pairs LIOT/B. Local IO line pairs LIOT/B are connected to main IO line pairs MIOT/B via transfer gates TG which function as switches.

Figure 2:
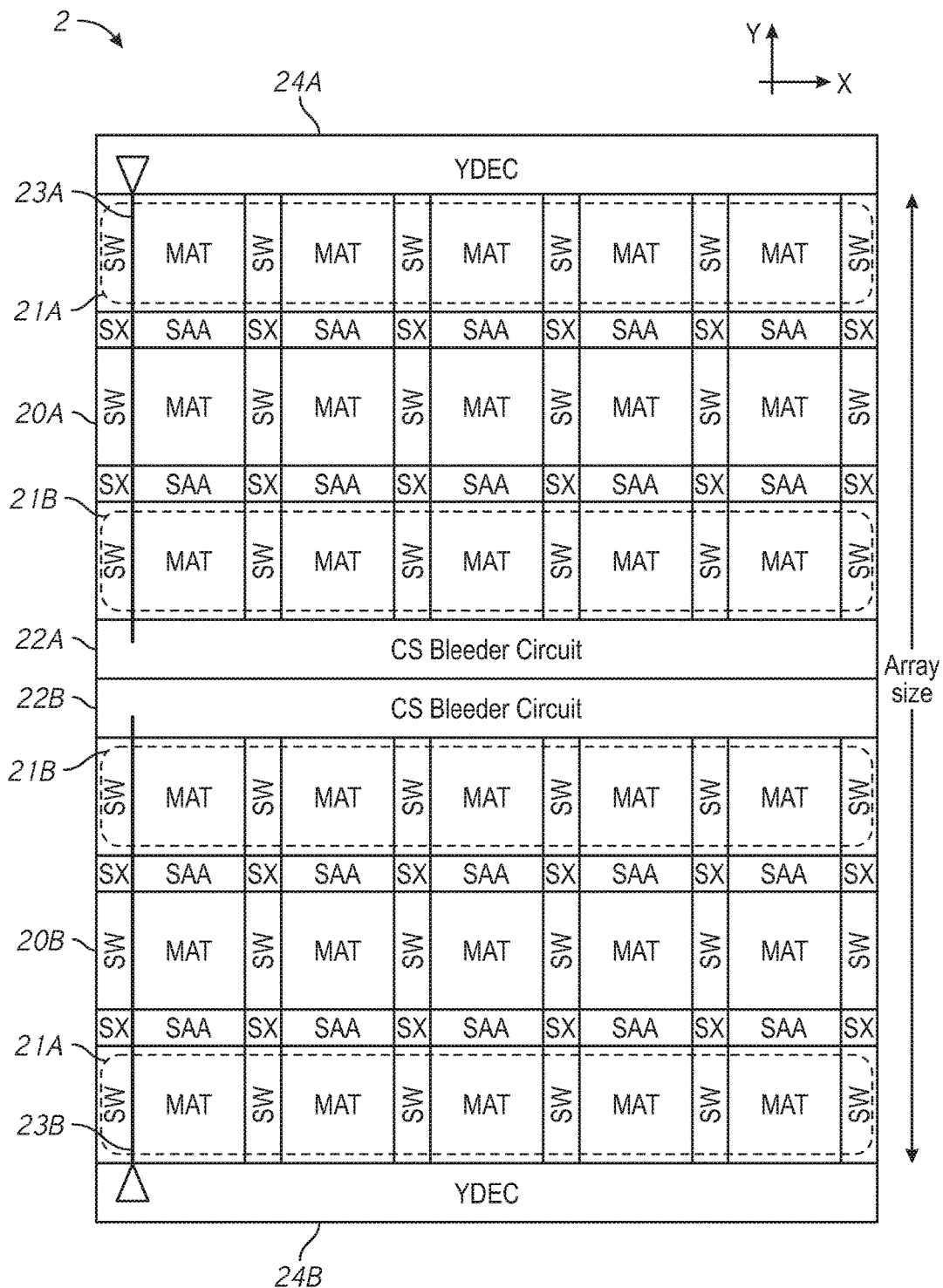
FIG. 2 is a layout diagram of an array in the memory chip in accordance with an embodiment of the present disclosure.

FIG. 2 is a layout diagram of an array 2 in the memory chip in accordance with an embodiment of the present disclosure. The array 2 may correspond to one memory cell array area ARY in the portion 11 in FIG. 1A. The array 2 may include sub arrays 20A and 20B arranged in the Y direction. Each of the sub arrays 20A and 20B may include a plurality of memory mats MAT arranged in the X- and Y-directions. Each of the sub arrays 20A and 20B may include a plurality of sub-word driver areas SW. For example, each sub-word driver area SW may be disposed between two memory mats MAT that are adjacent to each other in the X-direction. Each of the sub arrays 20A and 20B may include a plurality of sense amplifier areas SAA. For example, each sense amplifier areas SAA may be disposed between two memory mats MAT that are adjacent to each other in the Y-direction. The array 2 may further include a plurality of sub-word cross areas SX. For example, each sub-word cross area SX may be disposed in an area between two sub-word driver areas SW extending in the Y-direction crosses two sense amplifier areas SAA extending in the X-direction. Each sub-word cross area SX may include a sub amplifier, which is used to drive a main input/output line (MI/O), and the like.

The sub arrays 20A and 20B may include corresponding CS bleeder circuits 22A and 22B at a center area of the array 2. For example, the CS bleeder circuits 22A and 22B may be disposed adjacent to sides of the sub arrays 20A and 20B closer to the center area of the array 2 in the Y direction. Each of the sub arrays 20A and 20B may include a corresponding column selection (YS) line (e.g., 23A, 23B) coupling a corresponding column decoder YDEC (e.g., 24A, 24B) to the CS bleeder circuit (e.g., 22A, 22B). The CS bleeder circuits 22A and 22B may stabilize a voltage of a defective column selection (YS) line when it is in an open (disconnected) state. The plurality of memory mats MAT may include edge memory mats (MAT) 21A and 21B located at edge of the sub arrays 20A and 20B. Each edge memory mat (e.g., 21A, 21B) may have a half of effective memory cells because of being coupled to one sense amplifier area (SAA) located opposite to an edge side of each edge memory mat (e.g., 21A, 21B). The edge sides of edge memory mats 21A in the sub arrays 20A and 20B may be in direct contact with the column decoders YDEC 24A and 24B, respectively. The edge sides of edge memory mats 21B in the sub arrays 20A and 20B may be in direct contact with the CS bleeder circuits 22A and 22B, respectively.

Figure 3A:
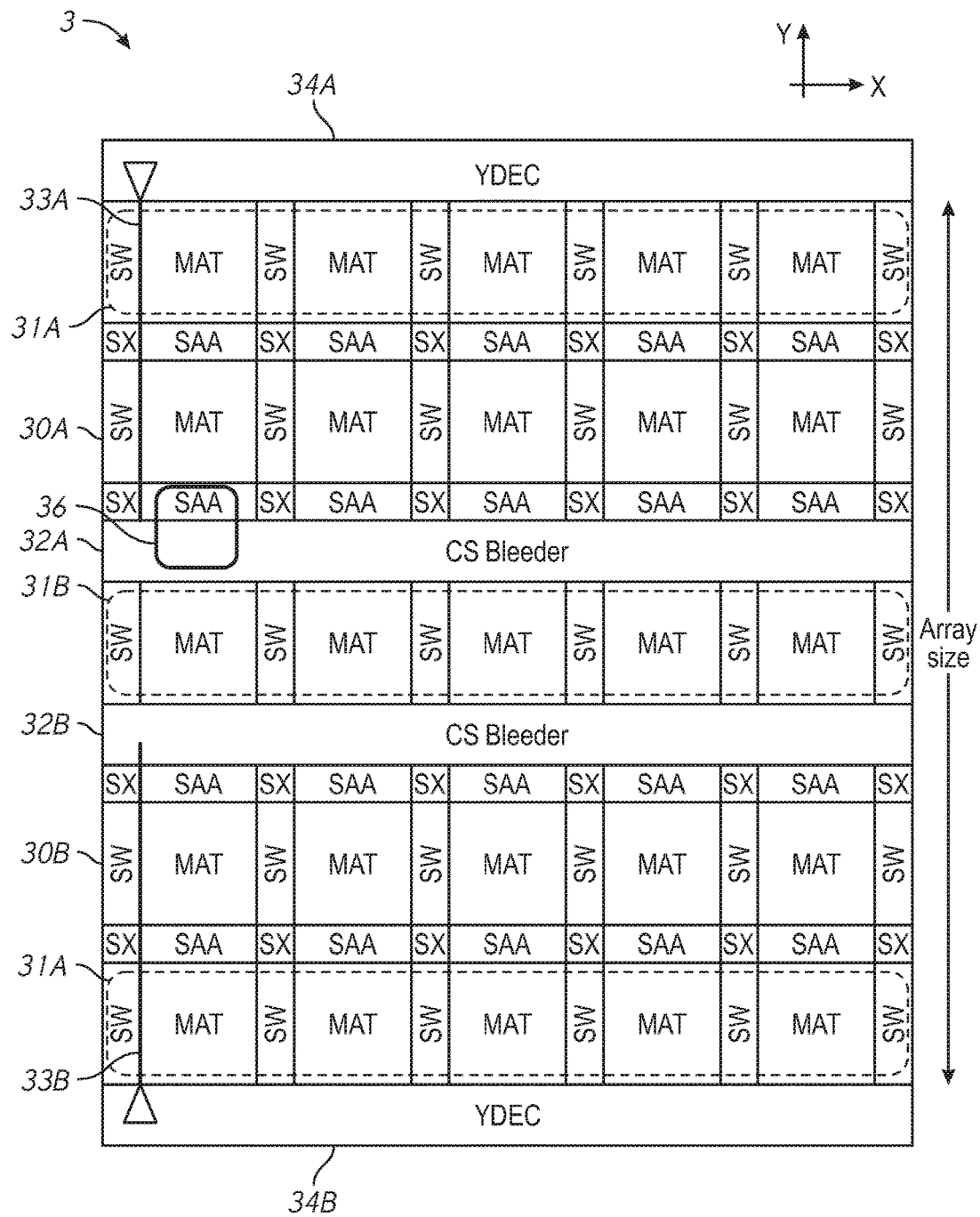
FIG. 3A is a layout diagram of an array in the memory chip in accordance with an embodiment of the present disclosure.

FIG. 3A is a layout diagram of an array 3 in the memory chip in accordance with an embodiment of the present disclosure. The array 3 may correspond to one memory cell array area ARY in a portion 11 in FIG. 1A. The array 3 may include a plurality of memory mats MAT arranged in the X- and Y-directions. The array 3 may include a plurality of sub-word driver areas SW. For example, each sub-word driver area SW may be disposed between two memory mats MAT that are adjacent to each other in the X-direction. The array 3 may include a plurality of sense amplifier areas SAA. For example, each sense amplifier areas SAA may be disposed between two memory mats MAT that are adjacent to each other in the Y-direction. The array 3 may further include a plurality of sub-word cross areas SX. For example, each sub-word cross area SX may be disposed in an area between two sub-word driver areas SW extending in the Y-direction crosses two sense amplifier areas SAA extending in the X-direction. Each sub-word cross area SX may include a sub amplifier, which is used to drive a main input/output line (MI/O), and the like.

The plurality of memory mats MAT may include edge memory mats (MAT) 31A located at edges of sub arrays 30A and 30B. The edge sides of edge memory mats 31A in the sub arrays 30A and 30B may be in direct contact with either the column decoder YDEC 34A and 34B, respectively. The plurality of memory mats MAT may include central memory mats (MAT) 31B in a central area of the array 3, arranged in the Y-direction between the sub arrays 30A and 30B. The sub arrays 30A and 30B may further include CS bleeder circuits 32A and 32B, respectively. The CS bleeder circuits 32A may be between the sub array 30A and the central memory mats 31B, and the CS bleeder circuits 32B may be between the sub array 30B and the central memory mats 31B. Each of the sub arrays 30A and 30B may include corresponding column selection (YS) lines (e.g., 33A, 33B) coupling corresponding column decoders YDEC (e.g., 34A, 34B) via memory mats MAT and sense amplifier areas SAA to the CS bleeder circuits (e.g., 32A, 32B). The CS bleeder circuits 32A and 32B may stabilize a voltage of a defective column selection (YS) line when it is in an open (disconnected) state. A portion 36 of the array 3 may include a CS bleeder circuit and a sense amplifier area SAA coupled by the column selection (YS) lines.

Figure 3B:
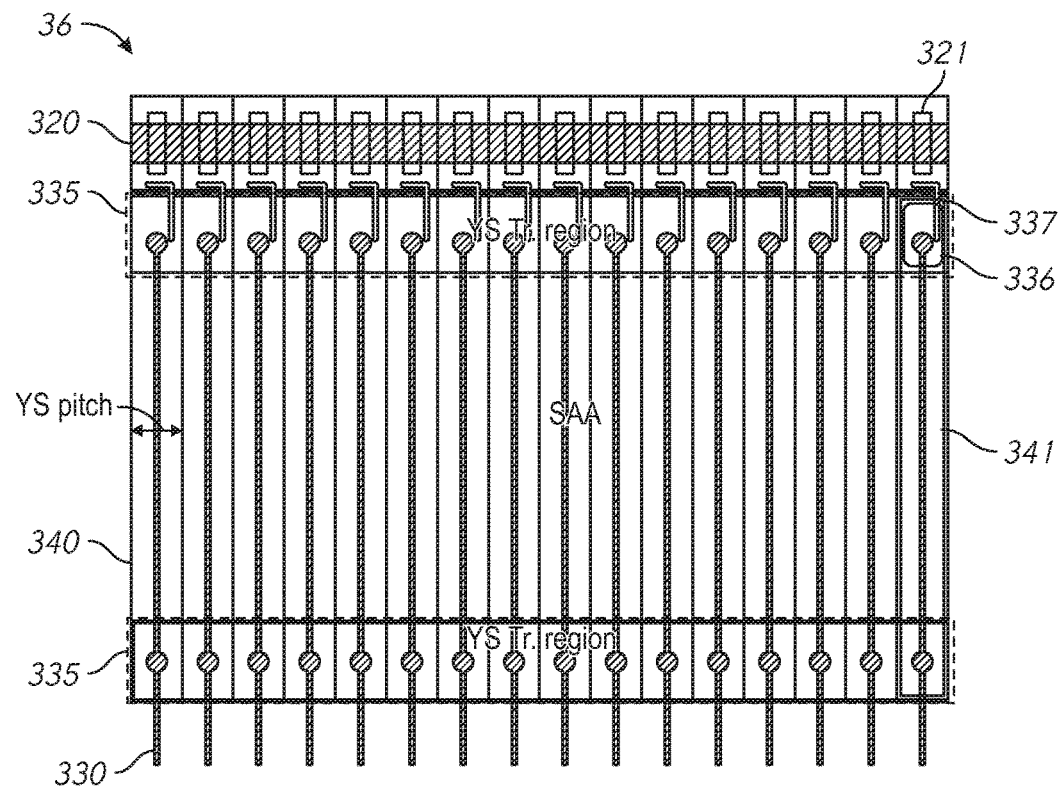
FIG. 3B is a schematic diagram of the portion of the array including the CS bleeder circuit and the sense amplifier area SAA in accordance with an embodiment of the present disclosure.
Figure 3C:
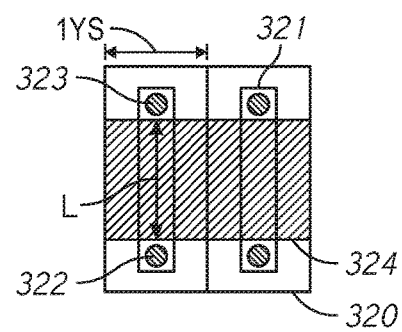
FIG. 3C is a schematic diagram of the CS bleeder circuit in accordance with an embodiment of the present disclosure.

FIG. 3B is a schematic diagram of the portion 36 of the array 3 including the CS bleeder circuit 320 and the sense amplifier area SAA 340 in accordance with an embodiment of the present disclosure. The sense amplifier area SAA 340 may include a plurality of YS transistor regions 335. The sense amplifier area SAA 340 includes a plurality of sense amplifier columns 341 that corresponds to a plurality of column selection (YS) lines 330. An area where each YS transistor region 335 overlaps each sense amplifier column 341 may include a YS transistor 336 coupled to a corresponding column selection (YS) line 330 at a sense node a sense node of the sense amplifier column 341. The YS transistor 336 may work as a column selection switch of the sense amplifier column 341. The YS transistor 336 has a gate that may be coupled to the corresponding column selection (YS) line. The CS bleeder circuit 320 may be used as the CS bleeder circuits (e.g., 32A, 32B) in FIG. 3A. The CS bleeder circuit 320 may include a plurality of CS bleeder transistors 321. Each CS bleeder transistor 321 may be coupled to a corresponding YS transistor 336 via a YS transistor channel (e.g., by gate wiring) 337 of the corresponding YS transistor 336. The YS transistor channel 337 may provide a relatively larger impedance between the CS bleeder transistor 321 and the YS transistor 336 rather than an interconnect such as M1 wire. FIG. 3C is a schematic diagram of the CS bleeder circuit 320 in accordance with an embodiment of the present disclosure. By using the YS transistor channel 337 for coupling the CS bleeder transistor 321 to the YS transistor 336, a space for a power supply region may be provided. For example, a distance L between a source 322 coupled to the YS transistor channel 337 and a drain 323 coupled to a power supply voltage VSS along a column line direction may be relatively short. The CS bleeder circuit 320 may include gates 324 of the plurality of CS bleeder transistors 321 coupled to a power supply voltage VDD that may be lower than a voltage of column selection (YS) lines 330 at a logic high level. Thus, a voltage of an end of each column selection (YS) line 330 closer to the CS bleeder circuit 320 may be stabilized to the power supply voltage VDD, when each column selection (YS) line 330 is defective and open. Because the CS bleeder circuit 320 may be coupled to the corresponding YS transistor 336 via the YS transistor channel (e.g., by gate wiring) 337 of the corresponding YS transistor 336, the CS bleeder circuit 320 may be located in proximity to one of the YS transistor regions 335.

Figure 3D:
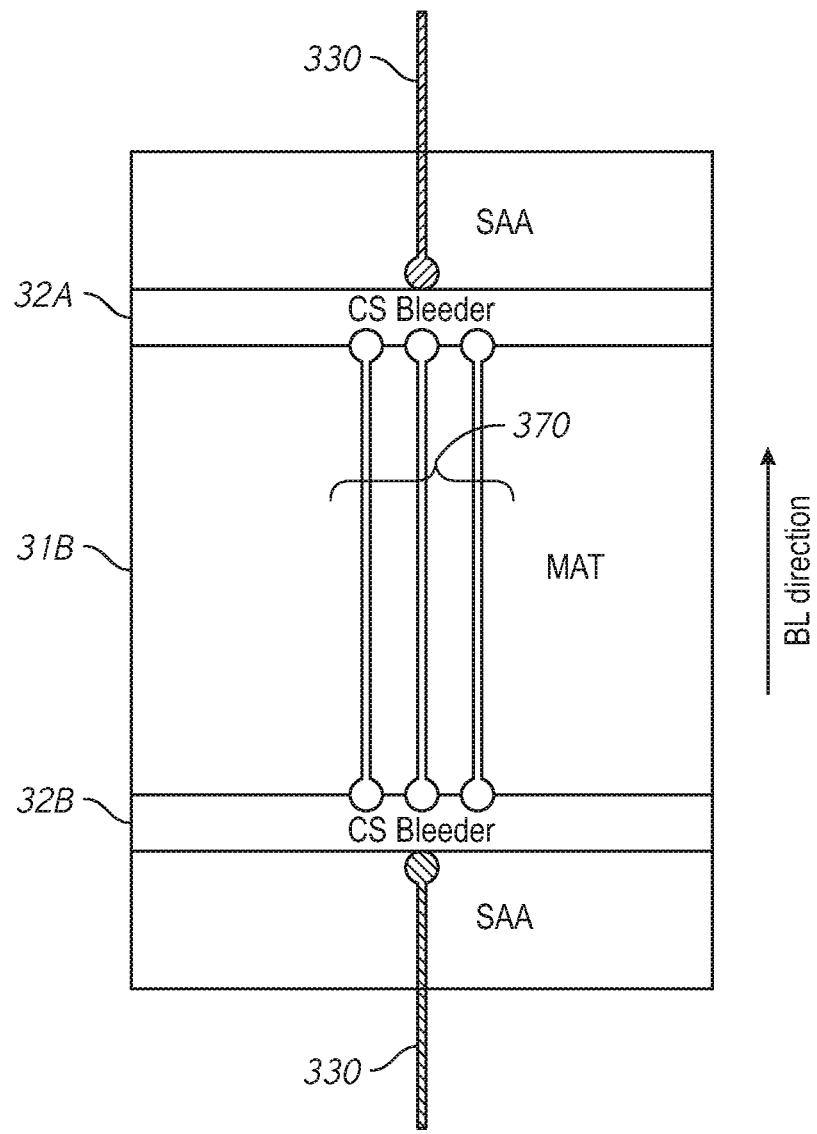
FIG. 3D is a schematic diagram of a central memory mats (MAT) between the CS bleeder circuits in accordance with an embodiment of the present disclosure.

FIG. 3D is a schematic diagram of a central memory mat (MAT) 31B between the CS bleeder circuits 32A and 32B in accordance with an embodiment of the present disclosure. The column selection (YS) lines 330 may be coupled to the CS bleeder circuits 32A and 32B. The central memory mat 31B may include memory cells decoupled (e.g., insulated) from the column selection (YS) lines 330 and further from the sense amplifier area (SAA). The central memory mat (MAT) 31B may be a power supply wire region include power supply lines 370, providing power supply to the CS bleeder circuits 32A and 32B. The column selection (YS) lines 33A and 33B may not pass through the central memory mat 31B.

Figure 3E:
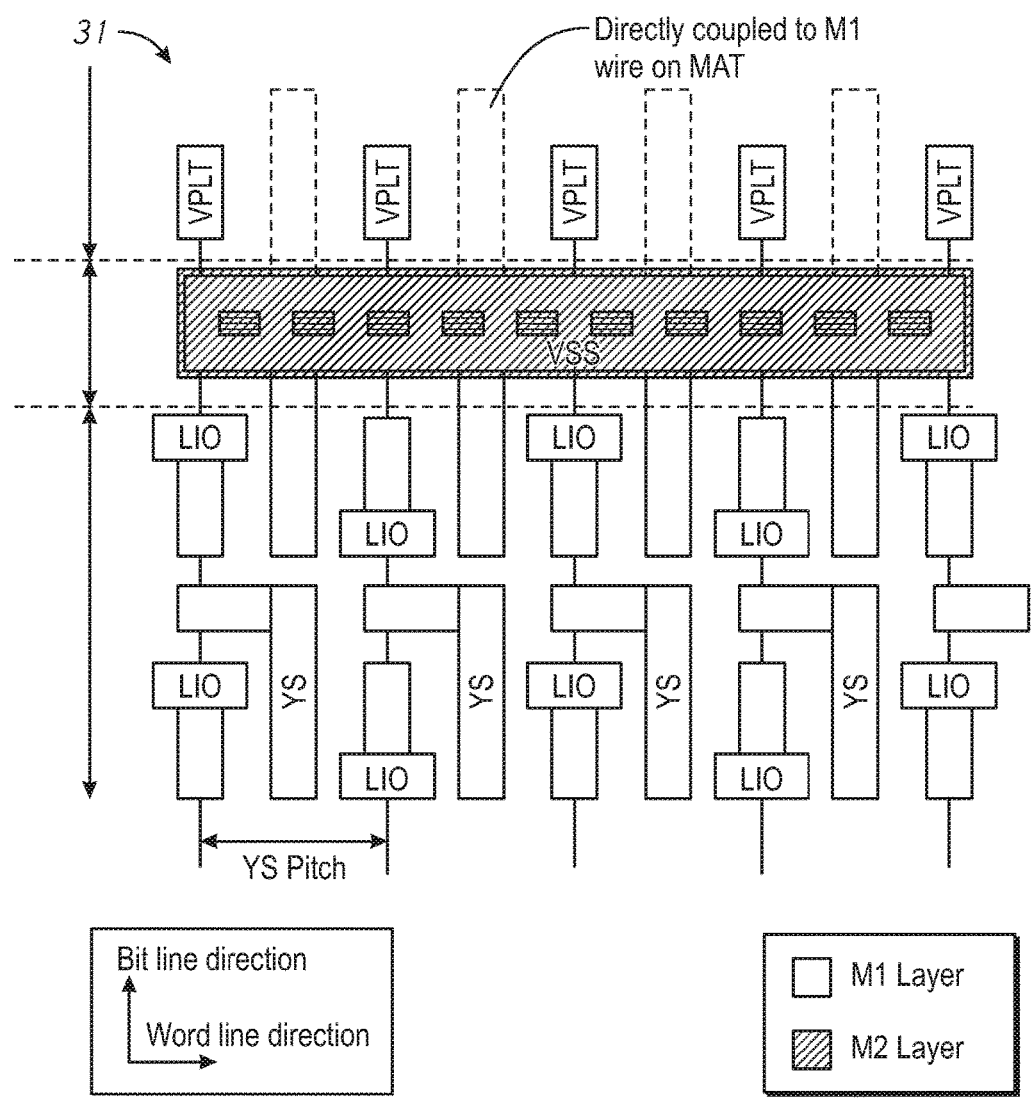
FIG. 3E is a layout diagram of a portion of the array with interconnect layers, in accordance with an embodiment of the present disclosure.

FIG. 3E is a layout diagram of a portion of the array 3 with interconnect layers, in accordance with an embodiment of the present disclosure. For example, the interconnect layers may include M1 layer and M2 layer. As shown in FIGS. 3A, 3B and 3D, a CS bleeder circuit 32 (e.g., the CS bleeder circuit 32A or 32B in FIG. 3A) may be disposed between a YS transistor region 38 (e.g. the YS transistor region 335 within a sense amplifier area SAA 340 in FIG. 3) and a memory mat MAT 31 (e.g., the central memory mat (MAT) 31B in FIG. 3A). The memory mat MAT 31 may be away from the column decoders YDEC (e.g., 34A, 34B). The CS bleeder circuit 32 may be coupled to a YS transistor (e.g., the YS transistor 336 in FIG. 3B) in the YS transistor region 38 using gate wiring and/or tungsten wiring (e.g., the YS transistor channel 337 in FIG. 3B). Thus, the YS transistor may be coupled to the column selection (YS) line and a local input/output line (LIO); however, the YS transistor may not be coupled to wires of the M1 layer in the memory mat MAT 31. The CS bleeder circuit 32 may be directly coupled to the wires of the M1 layer for power supply on the memory mat MAT 31.

Figure 3F:
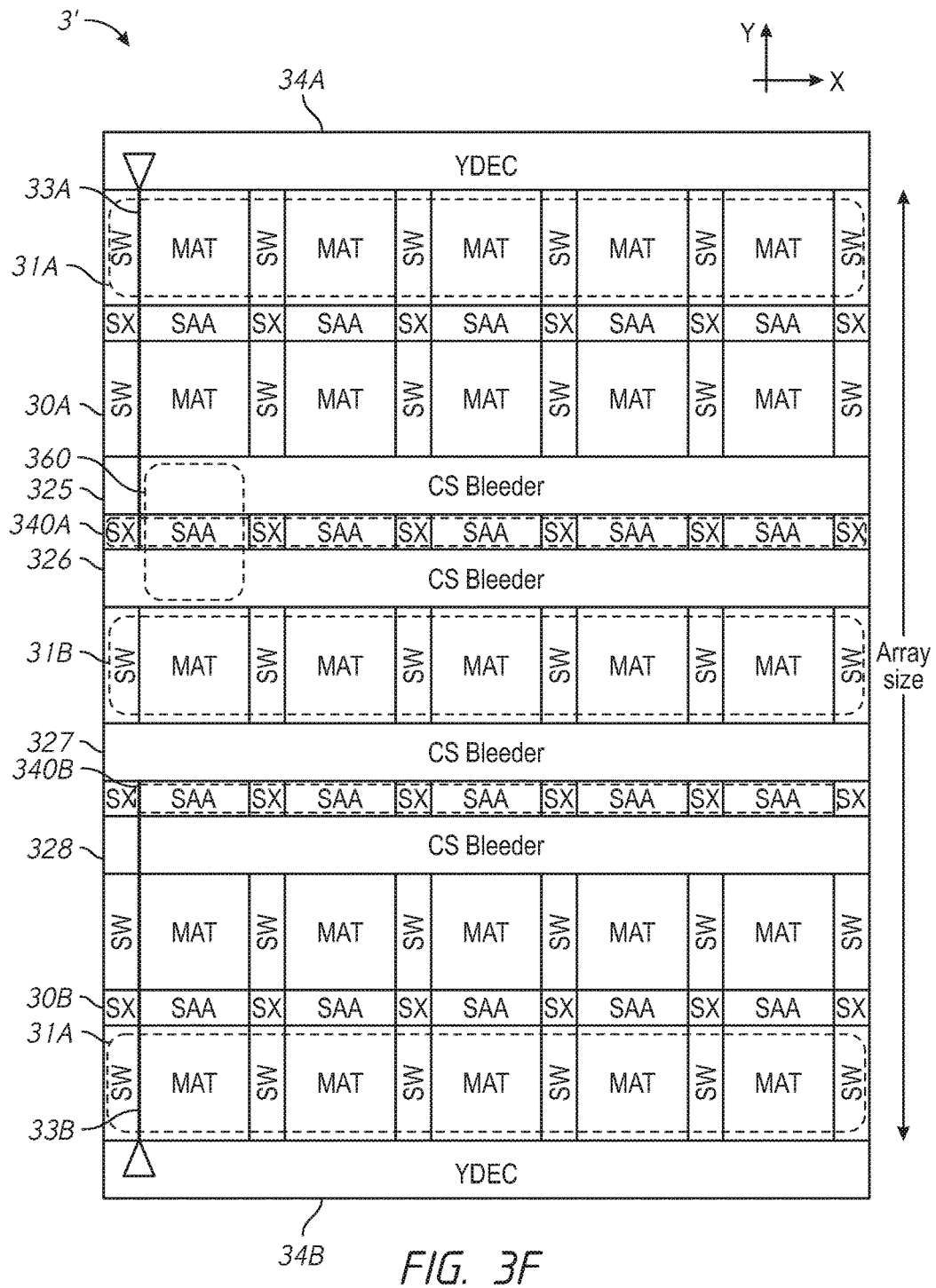
FIG. 3F is a layout diagram of an array in the memory chip in accordance with an embodiment of the present disclosure.

FIG. 3F is a layout diagram of an array 3' in the memory chip in accordance with an embodiment of the present disclosure. Description of components corresponding to components included in FIG. 3A will not be repeated and changes from FIG. 3A including positional relationships between the components will be described. The array 3' may include sub arrays 30A and 30B. The sub array 30A may further include CS bleeder circuits 325 and 326. The sub array 30A may further include sense amplifier areas SAA 340A between the CS bleeder circuits 325 and 326. The CS bleeder circuit 326 may be located between the sense amplifier areas SAA 340A and the central memory mats 31B. Similarly, the sub array 30B may further include CS bleeder circuits 327 and 328. The sub array 30B may further include sense amplifier areas SAA 340B between the CS bleeder circuits 327 and 328. The CS bleeder circuit 327 may be located between the sense amplifier areas SAA 340B and the central memory mats 31B. Each of the sub arrays 30A and 30B may include corresponding column selection (YS) lines (e.g., 33A, 33B) coupling corresponding column decoders YDEC (e.g., 34A, 34B) via memory mats MAT and the sense amplifier areas SAA (e.g., 340A, 340B) to the CS bleeder circuits (e.g., 325, 326, 327, 328). The CS bleeder circuits 325 to 328 may stabilize a voltage of a defective column selection (YS) line when it is in an open (disconnected) state. Since CS bleeder transistors in the CS bleeder circuits (e.g., 325, 326, 327, 328) are coupled to YS transistors in the sense amplifier areas SAA, the CS bleeder circuits (e.g., 325, 326, 327, 328) may be located at both sides of the sense amplifier areas SAA (e.g., 340A, 340B) along the Y direction. A portion 360 of the array 3' may include portions of two CS bleeder circuits (e.g., 325 and 326, or 327 and 328) and a portion of a sense amplifier area SAA (e.g., 340A or 340B) coupled by the column selection (YS) lines (e.g., 33A or 33B).

Figure 3G:
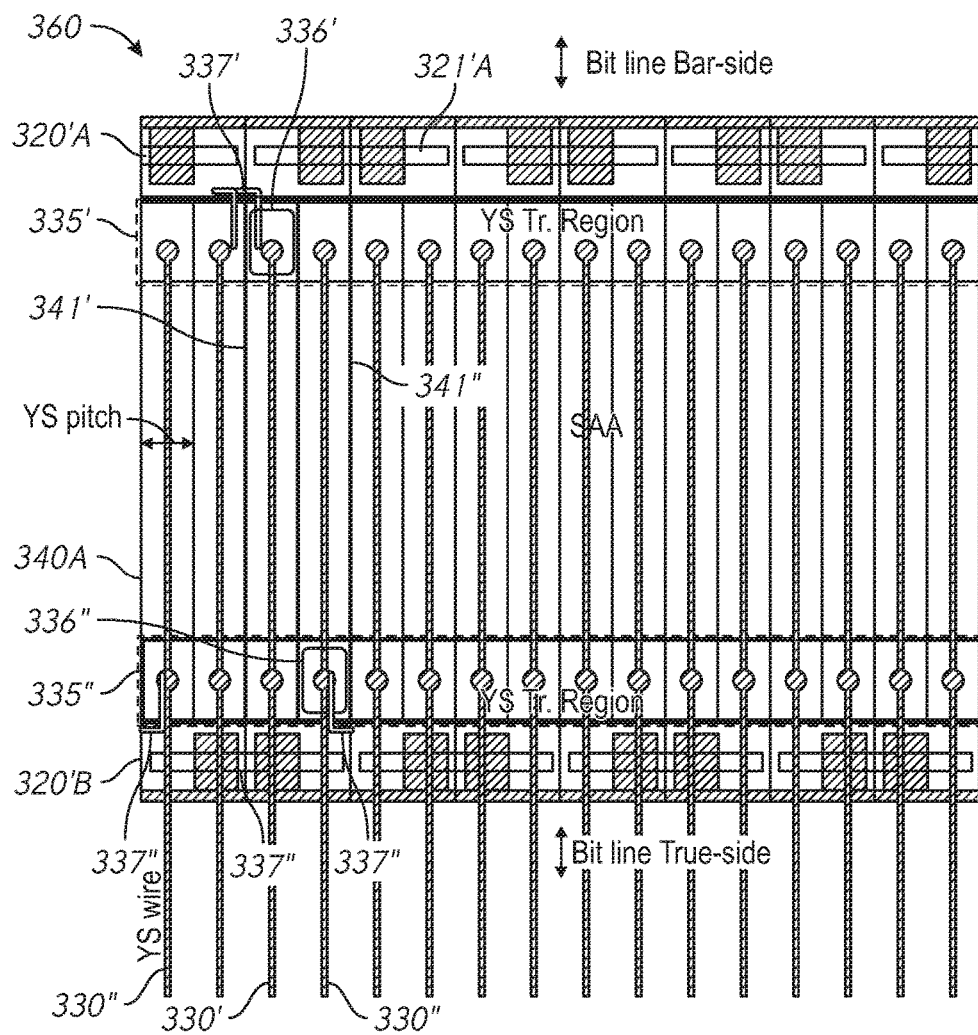
FIG. 3G is a schematic diagram of the portion of the array including the CS bleeder circuits and the sense amplifier area SAA in accordance with an embodiment of the present disclosure.

FIG. 3G is a schematic diagram of the portion 360 of the array 3' including a CS bleeder circuits 320'A and 320'B and the sense amplifier area SAA 340A in accordance with an embodiment of the present disclosure. The sense amplifier area SAA 340 may include a plurality of YS transistor regions 335' and 335". The sense amplifier area SAA 340A includes a plurality of sense amplifier columns 341' and 341" that corresponds to a plurality of column selection (YS) lines 330' and 330". An area where each YS transistor region 335' overlaps each sense amplifier column 341' may include a YS transistor 336' coupled to a corresponding column selection (YS) line 330'. An area where each YS transistor region 335" overlaps each sense amplifier column 341" may include a YS transistor 336" coupled to a corresponding column selection (YS) line 330". The CS bleeder circuits 320'A and 320'B may be used as the CS bleeder circuits (e.g., 325 and 326, or 327 and 328) in FIG. 3F. The CS bleeder circuit 320'A and 320'B may include a plurality of CS bleeder transistors 321'A and 321'B on a bit line (bar) side and a bit line (true) side, respectively. Each CS bleeder transistor 321'A on the bit line (bar) side may be coupled to a corresponding YS transistor 336' via a YS transistor channel (e.g., by gate wiring) 337' of the corresponding YS transistor 336'. Each CS bleeder transistor 321'B on the bit line (true) side may be coupled to a corresponding YS transistor 336" via a YS transistor channel (e.g., by gate wiring) 337" of the corresponding YS transistor 336".

Figure 3H:
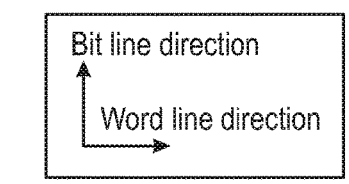
FIGS. 3H and 3I are schematic diagrams of the CS bleeder circuit in accordance with an embodiment of the present disclosure.
Figure 3H:
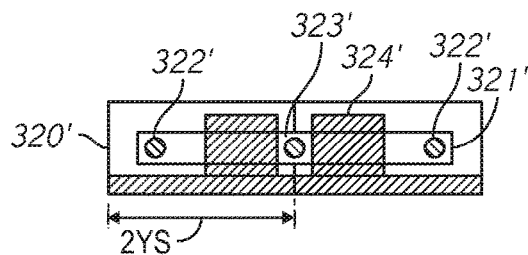
Figure 3I:
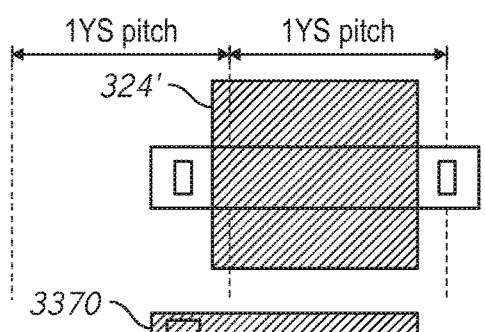

FIGS. 3H and 3I are schematic diagrams of a CS bleeder circuit 320' in accordance with an embodiment of the present disclosure. FIG. 3I is a left half portion of the CS bleeder circuit 320' in FIG. 3H. The CS bleeder circuit 320' may be used as the CS bleeder circuits 320'A or 320' B in FIG. 3G. By using the YS transistor channel (e.g., 337' or 337'), the CS bleeder transistor 321' (e.g., 321'A or 321'B) may be coupled to a plurality of YS transistors (e.g., 336' or 336") from the bit line (true) side or the bit line (bar) side to sense amplifier columns (e.g., 341' or 341") at sources 322' and 322" of the CS bleeder circuit 320' as shown in FIG. 3H. For example, the CS bleeder transistor 320' may be coupled to two column selection (YS) lines (e.g., 330" in FIG. 3G) via sources 322' and 322" in FIG. 3H coupled to the YS transistor channels 3370 (e.g., 337' and 337" in FIG. 3G). For example, the sources 322' and 322" and a drain 323' may be located along a word line direction perpendicular to the bit line direction. A distance between the source 322' or 322" and a drain 323' coupled to a power supply voltage VSS may be within a width of two column selection (YS) lines (=2YS). A CS bleeder circuit 320' may include gates 324' of CS bleeder transistors 321' coupled to a power supply voltage VDD that may be lower than a voltage of column selection (YS) lines 330' and 330" at a logic high level. Thus, a voltage of an end of each column selection (YS) line 330' and 330" closer to the CS bleeder circuit 320' (e.g., 320'A and 320'B) may be stabilized to the power supply voltage VDD, when each column selection (YS) line is defective and open. Because the CS bleeder circuit 320' may have a dimension of a width of the CS bleeder transistor 323' shorter than the distance L in the CS bleeder circuit 320 of FIG. 3C in a bit line direction, a length of the CS bleeder circuit 320' in the bit direction may be shorter and an area for the CS bleeder circuit 320' may be smaller.

Figure 4:
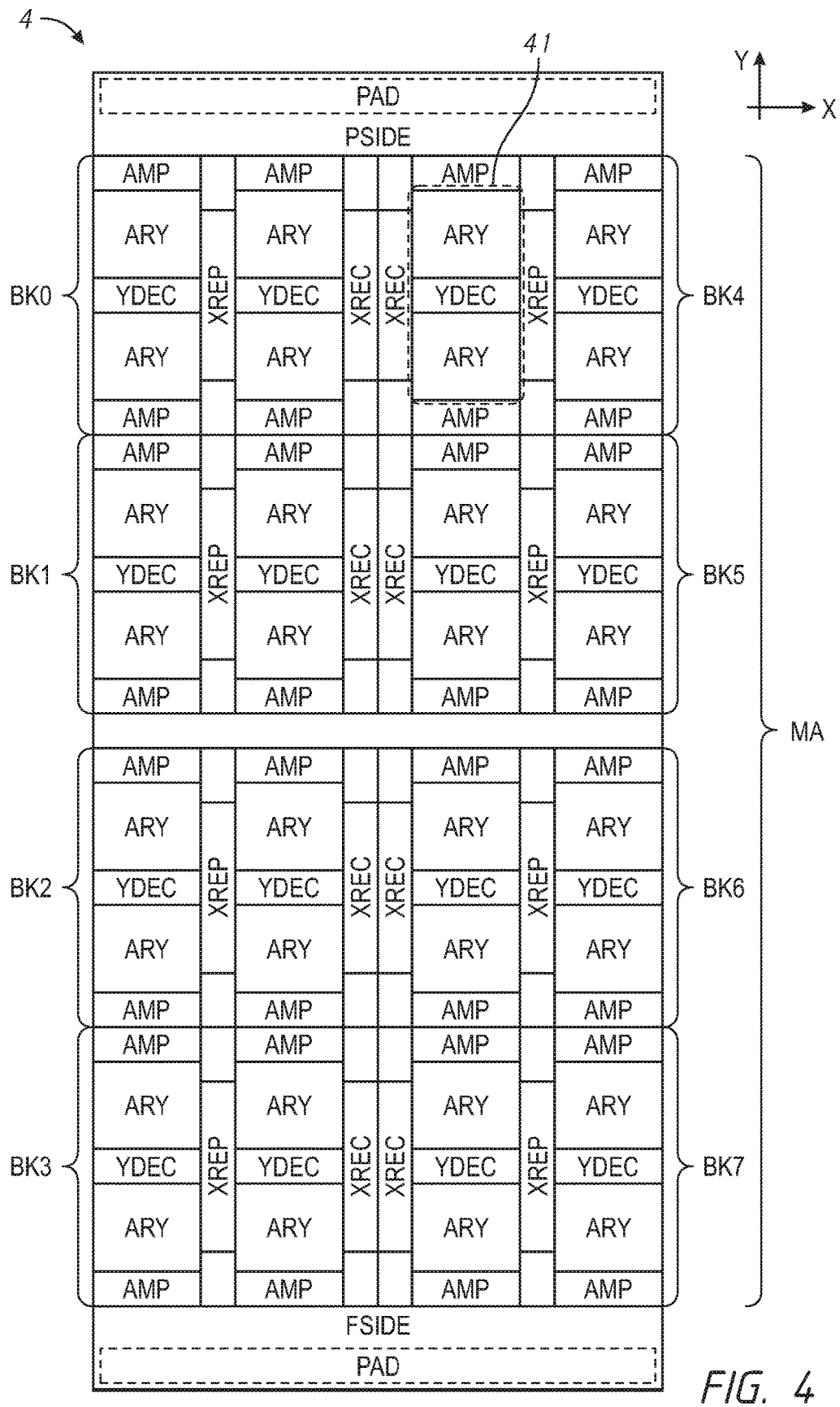
FIG. 4 is a layout diagram of a memory chip in a semiconductor memory device, in accordance with an embodiment of the present disclosure.

FIG. 4 is a layout diagram of a memory chip 4 in a semiconductor memory device, in accordance with an embodiment of the present disclosure. Description of components corresponding to components included in FIG. 1A will not be repeated and changes from FIG. 1A including positional relationships between the components will be described. Each memory bank of the memory banks BK0 to BK7 in the memory area MA may include four memory cell array areas ARY, two by two arranged next to each other in the X direction and in the Y direction, a row decoder XDEC and a repeater circuit XREP. Each memory bank may include a plurality of word lines, a plurality of bit lines, and a plurality of memory cells in each memory cell array areas ARY arranged at intersections of the plurality of word lines and the plurality of bit lines. For example, the row decoder XDEC may be located at one end of the memory bank in the X direction and the repeater circuit XREP may be located between the two memory cell array areas ARY in each memory bank. Each memory bank of the memory banks BK0 to BK7 may also include a portion 41 including a plurality of column decoders YDEC between two adjacent memory cell array areas ARY in the Y direction in each memory bank. Each memory bank of the memory banks BK0 to BK7 may also include a plurality of main amplifiers AMP adjacent to a plurality of sides of the portion 41 in the Y direction. Although it is not particularly limited, two memory cell array areas ARY of each memory bank may be selected by an address bit Y1 included in a column address.

Figure 5:
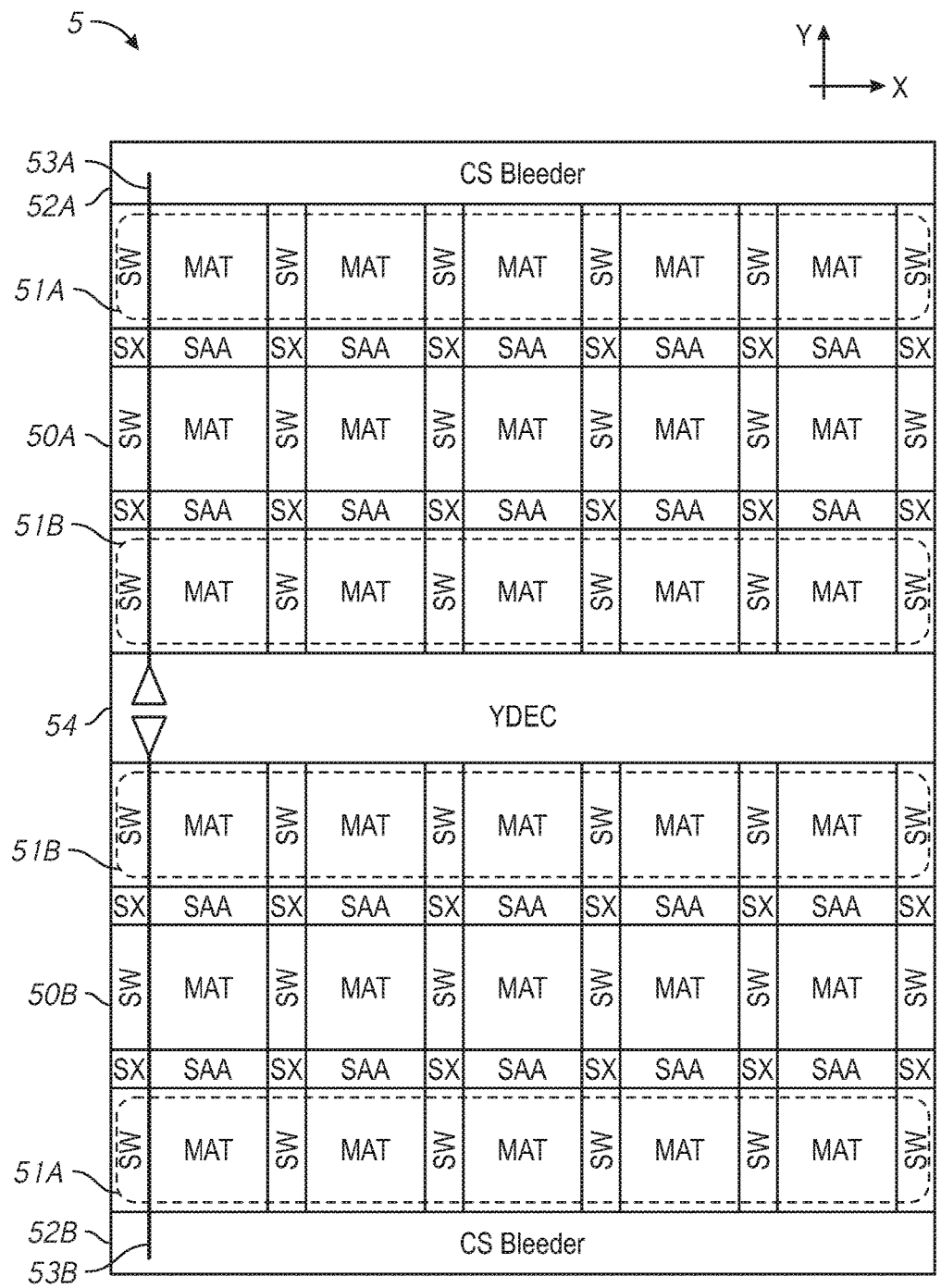
FIG. 5 is a layout diagram of arrays in the memory chip in accordance with an embodiment of the present disclosure.

FIG. 5 is a layout diagram of arrays 50A and 50B in the memory chip in accordance with an embodiment of the present disclosure. The arrays 50A and 50B may correspond to two memory cell array areas ARY in the Y direction in the portion 41 in FIG. 4. Each of the arrays 50A and 50B may include a plurality of memory mats MAT arranged in the X- and Y-directions. Each of the arrays 50A and 50B may include a plurality of sub-word driver areas SW. For example, each sub-word driver area SW may be disposed between two memory mats MAT that are adjacent to each other in the X-direction. Each of the arrays 50A and 50B may include a plurality of sense amplifier areas SAA. For example, each sense amplifier areas SAA may be disposed between two memory mats MAT that are adjacent to each other in the Y-direction. Each of the arrays 50A and 50B may further include a plurality of sub-word cross areas SX. For example, each sub-word cross area SX may be disposed in an area between two sub-word driver areas SW extending in the Y-direction crosses two sense amplifier areas SAA extending in the X-direction. Each sub-word cross area SX may include a sub amplifier, which is used to drive a main input/output line (MI/O), and the like. As described earlier in FIG. 4 referring to the portion 41, a column decoder YDEC 54 may be disposed between the arrays 50A and 50B.

The arrays 50A and 50B may include corresponding CS bleeder circuits 52A and 52B respectively, at sides opposite to the column decoder YDEC 54 in the Y direction. For example, the CS bleeder circuits 52A and 52B may be disposed adjacent to sides of the arrays 20A and 20B closer to the plurality of main amplifiers AMP outside of the portion 41. Each of the arrays 50A and 50B may include a corresponding column selection (YS) line (e.g., 53A, 53B) coupling the column decoder YDEC 54 to the CS bleeder circuit (e.g., 52A, 52B). The CS bleeder circuits 52A and 52B may stabilize a voltage of a defective column selection (YS) line when it is in an open (disconnected) state. The plurality of memory mats MAT may include edge memory mats (MAT) 51A and 51B located at edge of the arrays 50A and 50B. Each edge memory mat (e.g., 51A, 51B) may have a half of effective memory cells because of being coupled to one sense amplifier area (SAA) located opposite to an edge side of each edge memory mat (e.g., 51A, 51B). The edge sides of edge memory mats 51B in the arrays 50A and 50B may be in direct contact with the column decoder YDEC 54, respectively. The edge sides of edge memory mats 51A in the arrays 50A and 50B may be in direct contact with the CS bleeder circuits 52A and 52B, respectively.

Figure 6A:
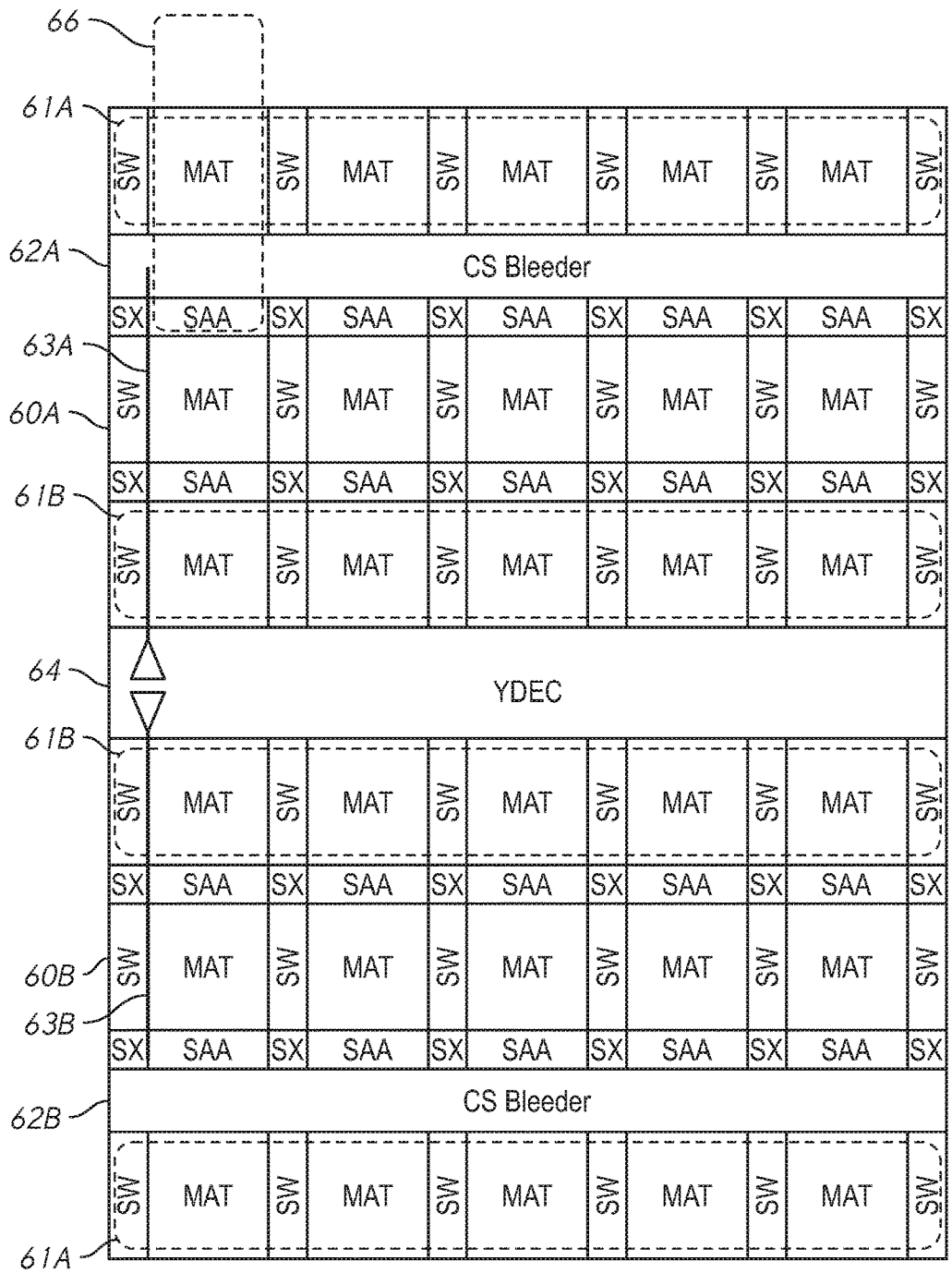
FIG. 6A is a layout diagram of arrays in the memory chip in accordance with an embodiment of the present disclosure.

FIG. 6A is a layout diagram of arrays 60A and 60B in the memory chip in accordance with an embodiment of the present disclosure. The arrays 60A and 60B may correspond to two memory cell array areas ARY in the Y direction in the portion 41 in FIG. 4. Each of the arrays 60A and 60B may include a plurality of memory mats MAT arranged in the X- and Y-directions. Each of the arrays 60A and 60B may include a plurality of sub-word driver areas SW. For example, each sub-word driver area SW may be disposed between two memory mats MAT that are adjacent to each other in the X-direction. Each of the arrays 60A and 60B may include a plurality of sense amplifier areas SAA. For example, each sense amplifier areas SAA may be disposed between two memory mats MAT that are adjacent to each other, or disposed at a side of one memory mat MAT, in the Y-direction. Each of the arrays 60A and 60B may further include a plurality of sub-word cross areas SX. For example, each sub-word cross area SX may be disposed in an area between two sub-word driver areas SW extending in the Y-direction crosses two sense amplifier areas SAA extending in the X-direction. Each sub-word cross area SX may include a sub amplifier, which is used to drive a main input/output line (MI/O), and the like. As described earlier in FIG. 4 referring to the portion 41, a column decoder YDEC 64 may be disposed between the arrays 60A and 60B.

The plurality of memory mats MAT may include edge memory mats (MAT) 61A located at edges of the arrays 60A and 60B in the Y-direction. The arrays 60A and 60B may further include CS bleeder circuits 62A and 62B, respectively. For example, the edge memory mats 61A in the arrays 60A and 60B may be in between peripheral circuits (e.g., main amplifiers AMP, etc.) and corresponding CS bleeder circuits 62A and 62B respectively in the Y-direction. The plurality of memory mats MAT in the arrays 60A and 60B may include central memory mats (MAT) 61B. The column decoder YDEC 64 may be arranged in the Y-direction between the plurality of central memory mats MAT 61B in the arrays 60A and 60B. Each of the arrays 60A and 60B may include corresponding column selection (YS) lines (e.g., 63A, 63B) coupling column decoders YDEC 64 via memory mats MAT and sense amplifier areas SAA to the CS bleeder circuits (e.g., 62A, 62B). The CS bleeder circuits 62A and may stabilize a voltage of a defective column selection (YS) line when it is in an open (disconnected) state. A portion 66 of the array 61A may include a CS bleeder circuit and a sense amplifier area SAA coupled by the column selection (YS) lines.

Figure 6B:
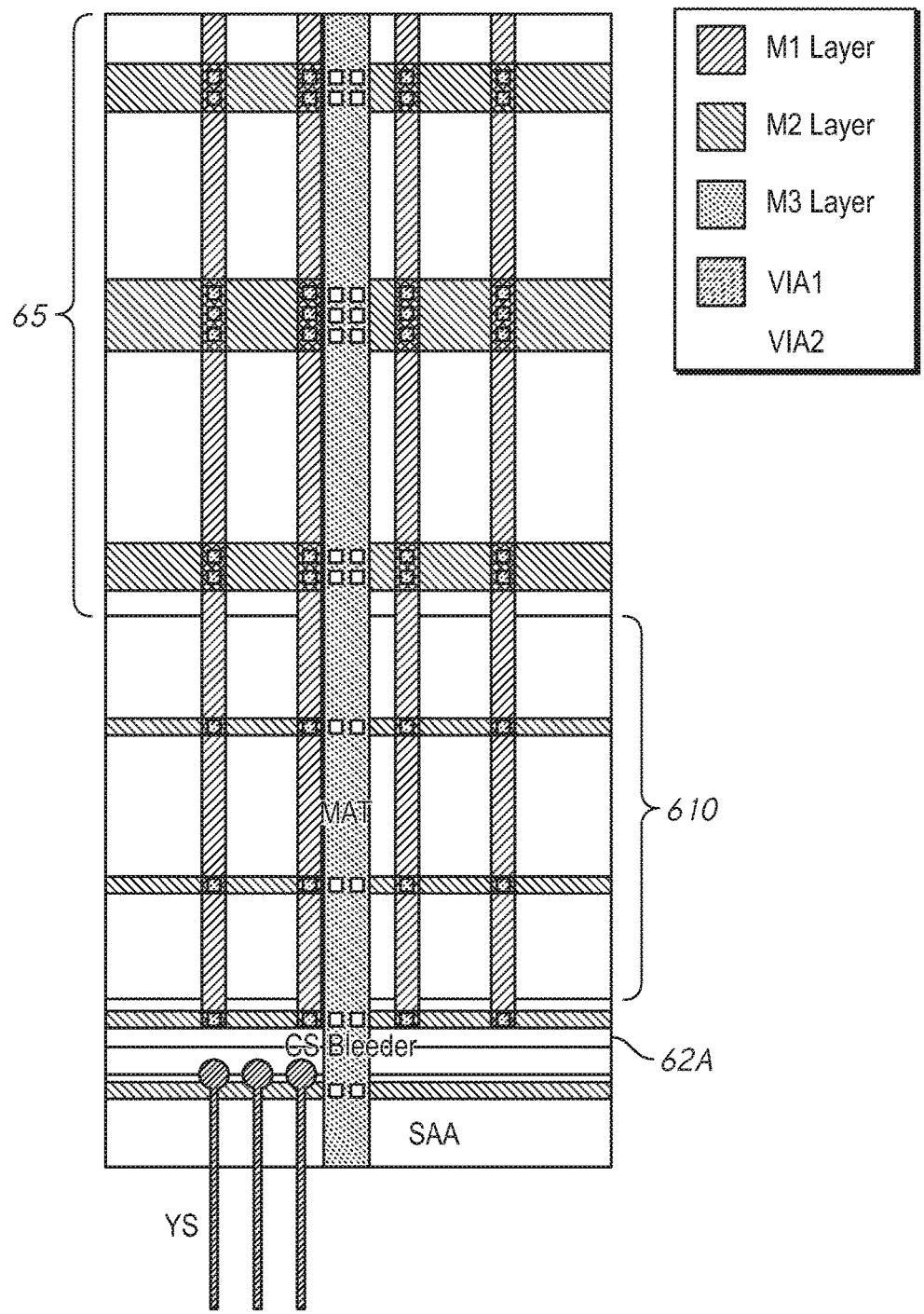
FIG. 6B is a layout diagram of the portion in the array with interconnect layers, in accordance with an embodiment of the present disclosure.

FIG. 6B is a layout diagram of the portion 66 in the array 61A with interconnect layers, in accordance with an embodiment of the present disclosure. The memory mat MAT 610 may be between the CS bleeder circuit 62A and a peripheral region 65 including peripheral circuits (e.g., main amplifiers AMP, address receiver circuits, data I/O circuits, etc.). For example, power supply lines on interconnect layers (e.g., M1, M2, M3 layers) in peripheral region 65 may be coupled to a power mesh structure including wires on interconnect layers (e.g., M1, M2, M3 layers) in a memory mat MAT 610. Thus, an impedance of the wires on the memory mat MAT 610 may be reduced. The portion 66 may include vias coupling the metal layers, such as vias VIA1 coupling M1 layer to M2 layer, and vias VIA2 coupling M2 layer to M3 layer. By increasing wires on M2 layer, power supply may be enhanced. Alternatively, the impedance of the power supply lines on the peripheral region 65 may be maintained while having thinner wires as the power supply lines in the peripheral region 65, which may reduce a size of the peripheral region 65.

Figure 6C:
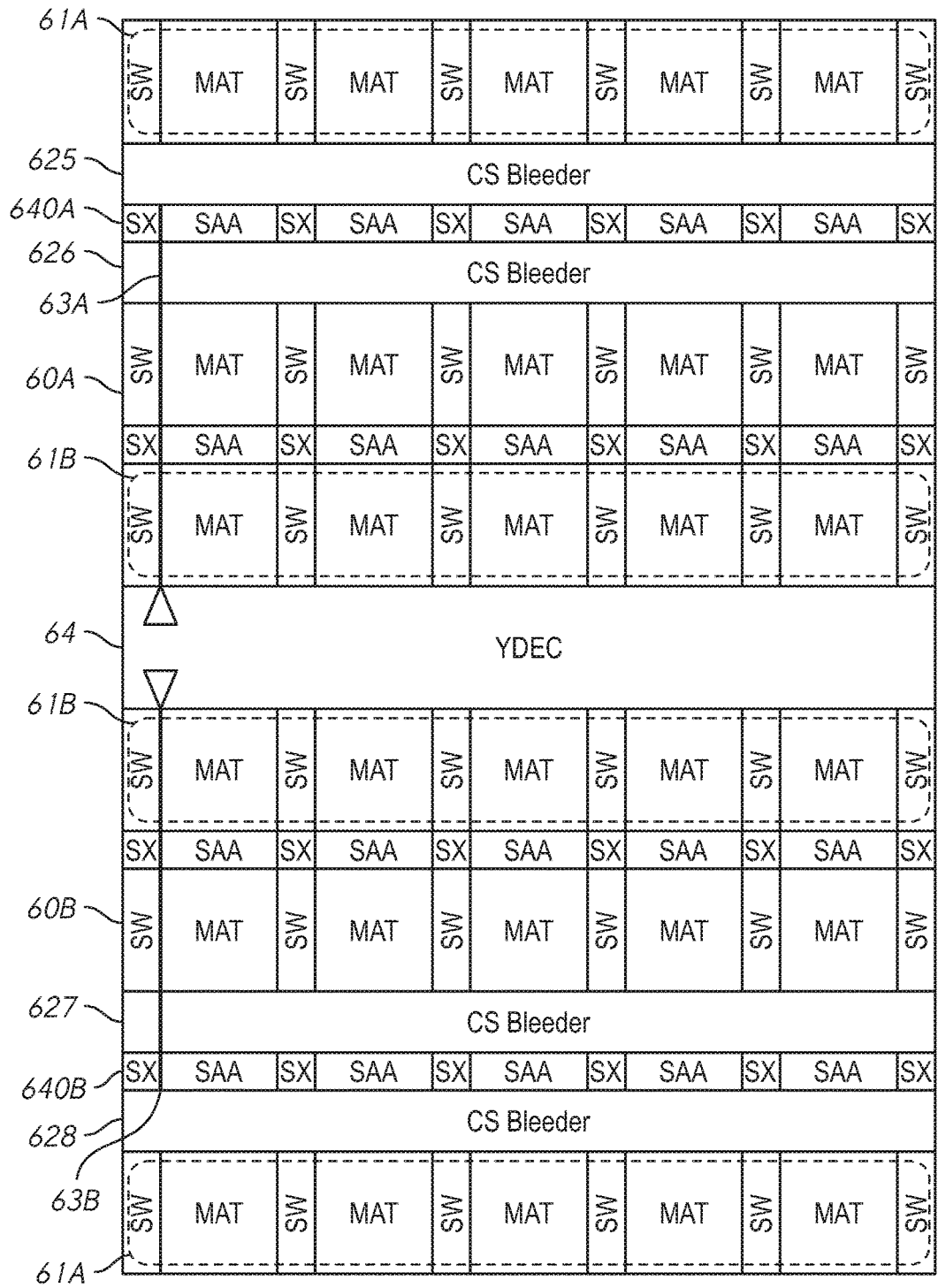
FIG. 6C is a layout diagram of arrays in the memory chip in accordance with an embodiment of the present disclosure.

FIG. 6C is a layout diagram of arrays 60A and 60B in the memory chip in accordance with an embodiment of the present disclosure. Description of components corresponding to components included in FIG. 6A will not be repeated and changes from FIG. 6A including positional relationships between the components will be described. The array 60A may further include CS bleeder circuits 625 and 626. The array 60A may further include sense amplifier areas SAA 640A between the CS bleeder circuits 625 and 626. The CS bleeder circuit 625 may be located between the sense amplifier areas SAA 640A and the edge memory mats 61A in the array 60A. Similarly, the array 60B may further include CS bleeder circuits 627 and 628. The array 60B may further include sense amplifier areas SAA 640B between the CS bleeder circuits 627 and 628. The CS bleeder circuit 628 may be located between the sense amplifier areas SAA 640B and the edge memory mats 61A in the array 60B. Each of the arrays 60A and 60B may include corresponding column selection (YS) lines (e.g., 63A, 63B) coupling a column decoder YDEC 64 via memory mats MAT and the sense amplifier areas SAA (e.g., 640A, 640B) to the CS bleeder circuits (e.g., 625, 626, 627, 628). The CS bleeder circuits 625 to 628 may stabilize a voltage of a defective column selection (YS) line when it is in an open (disconnected) state. Since CS bleeder transistors in the CS bleeder circuits (e.g., 625, 626, 627, 628) are coupled to YS transistors in the sense amplifier areas SAA, the CS bleeder circuits (e.g., 625 and 626, 627 and 628) may be located in proximity to (e.g., at both sides of) the sense amplifier areas SAA (e.g., 640A, 640B) along the Y direction.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:
1. A memory array comprising:
   a column decoder circuit configured to provide bit line selections for the memory array;
   a plurality of column selection lines coupled to the column decoder circuit; and
   a plurality of bleeder transistors, each bleeder transistor configured to be coupled to a respective column selection line of the plurality of column selection lines,
   wherein each bleeder transistor of the plurality of bleeder transistors further comprises:
      a gate configured to receive a first voltage; and
      a drain configured to receive a second voltage;
      wherein the drain of each bleeder transistor is located along a word line direction of the memory array.
2. The memory array of claim 1, wherein the first voltage is lower than a voltage of a column selection line at a logic high level.
3. The memory array of claim 1, wherein a source of each bleeder transistor is located along, d line direction of the memory array.
4. The memory array of claim 1, further comprising:
   a plurality of column selection transistors, each column selection transistor of the plurality of column selection transistors coupled to the respective column selection line that each bleeder transistor of the plurality of bleeder transistors is configured to be coupled.

5. The memory array of claim 4, wherein the plurality of bleeder transistors are further configured to be coupled to respective column selection lines of the plurality of column selection lines via an activated respective gate of a respective column selection transistor of the plurality of column selection transistors.

6. The memory array of claim 4, wherein a source of each bleeder transistor is configured to be coupled to the respective column selection line of the plurality of column selection lines.

7. The memory array of claim 6, wherein the source of each bleeder transistor is coupled to a respective column selection transistor via a channel of the respective column selection transistor of the plurality of column selection transistors.

8. The memory array of claim 6, wherein a distance between each source of each bleeder transistor and a drain of each bleeder transistor is within a width of two column selection lines.

9. The memory array of claim 1, wherein the second voltage corresponds to a VSS voltage.

10. The memory array of claim 1, wherein the column decoder circuit is configured to select a plurality of sense amplifiers in a memory array area based on a column address.

11. The memory array of claim 1, wherein each bleeder transistor is configured to stabilize a voltage of the respective column selection line when the respective column selection line is disconnected or in an open state.

12. A semiconductor device comprising:
a column decoder circuit configured to provide bit line selections for a plurality of bit lines of a memory array;
the plurality of bit lines coupled to the column decoder circuit;
a plurality of column selection transistors, each column selection transistor of the plurality of column selection transistors coupled to a corresponding bit line of the plurality of bit lines; and
a plurality of bleeder transistors configured to be coupled to the corresponding bit lines via respective gates of a respective column selection transistor of the plurality of column selection transistors.

13. The semiconductor device of claim 12, wherein the plurality of bleeder transistors comprises a first plurality of bleeder transistors configured to be coupled to a first plurality of bit lines of the plurality of bit lines, and wherein the plurality of bleeder transistors further comprises a second plurality of bleeder transistors configured to be coupled to a second plurality of bit lines, wherein the first plurality of bit lines are located on a first bit line side of a sense amplifier area, and wherein the second plurality of bit lines are located on a second bit line side of the sense amplifier area.

14. The semiconductor device of claim 13, wherein the first bit line side corresponds to a bar bit line side of the sense amplifier area, and wherein the second bit line side corresponds to a true bit line side.

15. The semiconductor device of claim 13, wherein the sense amplifier area comprises a plurality of sense amplifiers configured to sense a voltage change between the first bit line side and the second bit line side.

16. The semiconductor device of claim 15, wherein the column decoder circuit is configured to provide the bit line selections to the plurality of sense amplifiers based on a column address of the memory array.

17. The semiconductor device of claim 13, wherein the plurality of column selection transistors comprises a first plurality of column selection transistors configured to couple the first plurality of bit lines to the first plurality of bleeder transistors, and wherein the plurality of column selection transistors further comprises a second plurality of column selection transistors configured to couple the second plurality of bit lines to the to the second plurality of bleeder transistors.

18. The semiconductor device of claim 17, wherein the plurality of bit lines are disposed between the first plurality of column selection transistors and the second plurality of column selection transistors.

19. The semiconductor device of claim 12, wherein each bleeder transistor of the plurality of bleeder transistors comprises:
a gate configured to receive a first power supply voltage that is lower than a voltage of the bit line at a logic high level; and
a drain coupled to a second power supply voltage.

20. The semiconductor device of claim 12, wherein each bleeder transistor of the plurality of bleeder transistors further comprises:
a source coupled to a gate of the respective column selection transistor of the plurality of column selection transistors.

21. A device comprising:
an address decoder circuit;
at least one selection line couple to the address decoder circuit;
at least one sense amplifier including a sense node;
at least one selection transistor coupled to the sense node of the sense amplifier, the at least one selection transistor including a gate electrode coupled to the selection line; and
at least one bleeder transistor including a gate electrode and a source and a drain;
wherein the gate electrode of the at least one selection transistor is elongated to provide an elongated portion; and
wherein the elongated portion of the gate electrode of the at least one selection transistor has an end part that is coupled to one of the source and drain of the at least one bleeder transistor.

22. The device of claim 21, wherein the at least one bleeder transistor is configured to receive a first voltage at the gate electrode thereof and to receive a second voltage at the other of the source and drain thereof.

23. The device of claim 22, wherein the first voltage is lower than a voltage of the selection line at a logic high level.

24. The device of claim 21,
wherein the selection line extends in a first direction; and
wherein the source and the drain of the at least one bleeder transistor are arranged in line in the first direction.

25. The device of claim 24, wherein the elongated portion of the gate electrode of the at least one selection transistor extends in the first direction.

26. The device of claim 25, wherein the at least one selection transistor is disposed between the at least one selection line and the at least one bleeder transistor.

27. The device of claim 25, further comprising at least one data line;
wherein the at least one selection transistor is further coupled to the at least one data line.

* * * * *